United States Patent [19]

Kubo et al.

[11] Patent Number: 5,334,302
[45] Date of Patent: Aug. 2, 1994

[54] MAGNETRON SPUTTERING APPARATUS AND SPUTTERING GUN FOR USE IN THE SAME

[75] Inventors: Kenichi Kubo, Kofu; Yasuo Kobayashi, Nirasaki; Koji Koizumi, Yamanashi, all of Japan

[73] Assignee: Tokyo Electron Limited, Tokyo, Japan

[21] Appl. No.: 976,453

[22] Filed: Nov. 13, 1992

[30] Foreign Application Priority Data

Nov. 15, 1991 [JP] Japan ............ 3-326675
Feb. 18, 1992 [JP] Japan ............ 4-69717

[51] Int. Cl.$^5$ .................. C23C 14/34
[52] U.S. Cl. .......... 204/298.18; 204/298.07; 204/298.09; 204/298.26; 204/298.28
[58] Field of Search ........ 204/192.12, 298.07, 204/298.09, 298.12, 298.15, 298.18, 298.23, 298.26, 298.27, 298.28

[56] References Cited

U.S. PATENT DOCUMENTS

| | | |
|---|---|---|
| 2,146,025 | 2/1939 | Penning . |
| 3,616,450 | 10/1971 | Clark . |
| 3,711,398 | 1/1973 | Clarke . |
| 3,878,085 | 4/1975 | Corbani . |
| 4,006,073 | 2/1977 | Welch . |
| 4,025,410 | 5/1977 | Stewart ............ 204/298.28 X |
| 4,547,279 | 10/1985 | Kiyota et al. ....... 204/298.18 X |
| 4,604,180 | 8/1986 | Hirukawa et al. ...... 204/298.18 |
| 4,622,121 | 11/1986 | Wegmann et al. ...... 204/298.18 |
| 4,664,935 | 5/1987 | Strahl ............ 204/298.28 X |
| 4,673,480 | 6/1987 | Lamont, Jr. .......... 204/298.18 |
| 4,724,060 | 2/1988 | Sakata et al. ....... 204/298.12 X |
| 4,747,926 | 5/1988 | Shimizu et al. ....... 204/298.18 X |

FOREIGN PATENT DOCUMENTS

| | | |
|---|---|---|
| 51-29514 | 8/1976 | Japan . |
| 52-56084 | 5/1977 | Japan . |
| 52-47308 | 12/1977 | Japan . |
| 0077459 | 4/1987 | Japan .......... 204/298.18 |
| 0100267 | 4/1989 | Japan .......... 204/298.18 |

Primary Examiner—Nam Nguyen
Attorney, Agent, or Firm—Oblon, Spivak, McClelland, Maier & Neustadt

[57] ABSTRACT

A magnetron sputtering apparatus which includes a vacuum chamber, a plurality of sputtering guns, arranged in the vacuum chamber, for emitting sputter particles, a support member for supporting an object to be processed, on which a thin film is to be formed within the vacuum chamber, and a movement mechanism for moving the sputtering guns and the support member relative to each other, wherein sputter particles sputtered from the target by the plasma produced in the recess are deposited on the object to be processed. Each sputtering gun includes a target having a recess, a sputtering gas supplying pass for supplying a sputtering gas into the recess, an electric field producing mechanism for producing an electric field in the recess, thereby generating a plasma of the sputtering gas, and a magnetic field producing mechanism for production, in the recess, of a magnetic field including a component which crosses the electric field at right angles.

25 Claims, 10 Drawing Sheets

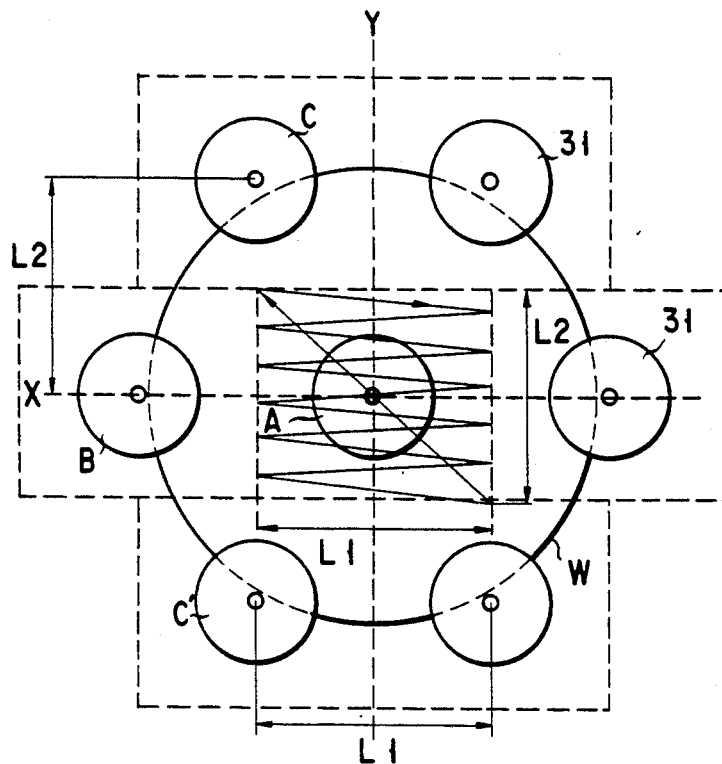
F I G. 6
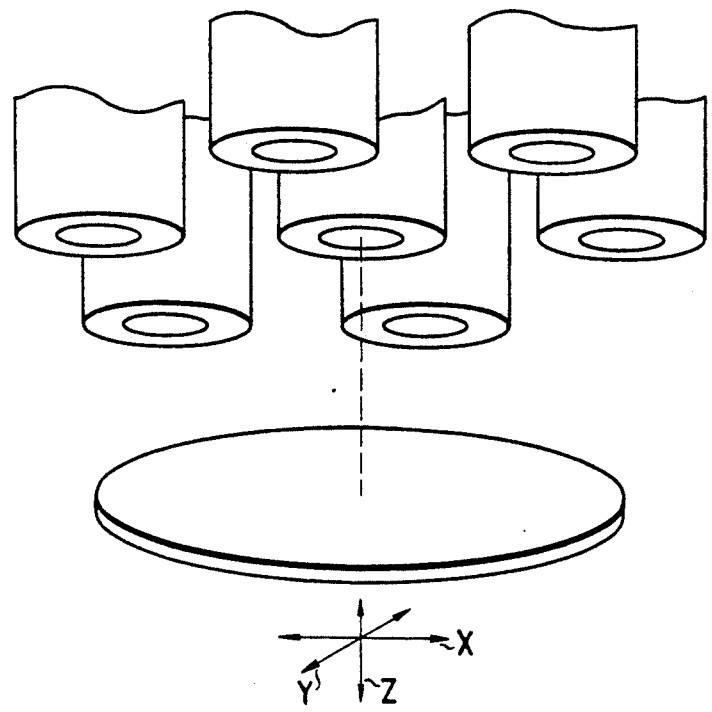
F I G. 7

MAGNETRON SPUTTERING APPARATUS AND SPUTTERING GUN FOR USE IN THE SAME

BACKGROUND OF THE INVENTION

1. Field of the Invention

The present invention relates to a magnetron sputtering apparatus for depositing a thin film on, for example, a semiconductor wafer and to a sputtering gun used in the magnetron sputtering apparatus.

2. Description of the Related Art

A magnetron sputtering apparatus has a vacuum chamber. The vacuum chamber accommodates a substrate (e.g. a semiconductor wafer) on which a thin film is to be formed, and a sputtering gun. The sputtering gun has a target situated to face the substrate, and a sputtering electrode.

In sputtering, a sputtering gas atmosphere (generally, argon gas) of an m Torr order is maintained in the vacuum chamber, and a negative voltage is generally applied from a DC power supply to a sputtering target via a sputtering electrode having a cooling mechanism. On the other hand, such parts as an anode, a shield, etc. which are situated at a distance of several millimeters from the sputtering target and sputtering electrode are generally kept at a grounding potential along with the vacuum chamber. A magnetic circuit is provided near the rear surface of the sputtering target. Thereby, a parallel magnetic field is applied to the surface of the sputtering target. Thus, a crossed electromagnetic field is produced on the surface of the sputtering target and thereby a cyclonic motion of electrons occurs in the plasma. Stable sputtering can be performed with a relatively low pressure.

Generally, a target of a conventional sputtering gun has a flat shape or an inverted-conical sputtering surface having a gentle gradient, and the diameter of the target is greater than that of a wafer.

With a recent increase in IC integration density, the diameter of a via hole or a contact hole is decreased to, e.g. 0.5 micron while the thickness of the wafer is substantially unchanged. As a result, the aspect ratio of the via hole or contact hole increases.

When a thin film is formed on such a high-integration wafer with use of a conventional flat target, the following problems arise.

FIG. 1 shows a sputtering apparatus having a flat target 2. Sputter particles emitted from the respective areas of the surface of the target 2 include various directional components, as shown in circles 3.

A ULSI 1 of high integration of 4M-DRAM or above, which is used as substrate, has a contact hole (or via hole) 5 having a diameter of 0.5 micron and a depth of 1 micron (i.e. aspect ratio=2). When a conductive film 4 is formed by sputtering on the ULSI 1, sputter particles enter the contact hole 5 not only in a vertical direction but also in other directions. Consequently, sputter particles are densely deposited on a shoulder portion of the contact hole 5 and this narrows the opening portion of the contact hole 5. As a result, a conductive film of a sufficient thickness cannot be formed on the inner surface of the contact hole 5. A film having only a thickness of about 0.1 micron is formed in the contact hole 5, and step coverage (i.e. the deposition ratio of the step portion) is 10% or less. Specifically, it is pointed out that when the conventional flat sputtering gun is used for an ULSI with a contact hole or via hole having a diameter of 0.5 micron or less, the step coverage and the deposition on the hole bottom decrease.

Furthermore, even with a magnetron sputtering apparatus capable of sputtering at a relatively low pressure, the generation of plasma is not stable unless the sputtering gas pressure is greater than 1 mTorr. Since the pressure in the entire space for processing must be increased up to a pressure ensuring stable processing, a considerable amount of sputter articles and sputter gas particles collide with one another. Thus, the conventional magnetron sputtering apparatus does not have sufficient sputtering efficiency.

SUMMARY OF THE INVENTION

An object of the present invention is to provide a magnetron sputtering apparatus capable of controlling the direction in which sputter particles are emitted, achieving high step coverage and depositing a sufficient amount of sputter particles in a hole in a high-integration semiconductor wafer, and a sputtering gun used in this apparatus.

Another object of the invention is to provide a magnetron sputtering apparatus capable of performing sputtering in the state wherein the sputtering gas pressure in the entire sputtering processing space is kept low, and to provide a sputtering gun used in this apparatus.

Still another object of the invention is to provide a magnetron sputtering apparatus capable of forming a thin film quickly while the step coverage is kept high.

According to one aspect of the invention, there is provided a magnetron sputtering apparatus comprising: a vacuum chamber; a sputtering gun, provided in the vacuum chamber, for emitting sputter particles, the sputtering gun including, a target having a recess, sputtering gas supplying means for supplying a sputtering gas into the recess, electric field producing means for producing an electric field in the recess, thereby generating a plasma of the sputtering gas, and magnetic field producing means for producing, in the recess, a magnetic field including a component crossed to the electric field at right angles; a support member for supporting an object to be processed, on which a thin film is to be formed within the vacuum chamber; and moving means for moving the sputtering guns and the support member relative to each other, wherein sputter particles sputtered from the target by the plasma produced in the recess are deposited on the object to be processed.

According to another aspect of the invention, there is provided a magnetron sputtering gun comprising: a target having a recess, sputtering gas supplying means for supplying a sputtering gas into the recess, electric field producing means for producing an electric field in the recess, thereby generating a plasma of the sputtering gas, and magnetic field producing means for producing, in the recess, a magnetic field including a component crossed to the electric field; wherein sputter particles are emitted from the target by the plasma produced in the recess.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 schematically shows an arrangement of targets of a sputtering gun assembly of the apparatus of FIG. 2;

FIG. 7 is a schematic view for describing relative movement of a wafer and sputtering guns of the apparatus of FIG. 2;

DESCRIPTION OF THE PREFERRED EMBODIMENTS

Preferred embodiments of the present invention will now be described with reference to the accompanying drawings.

Figure 2:
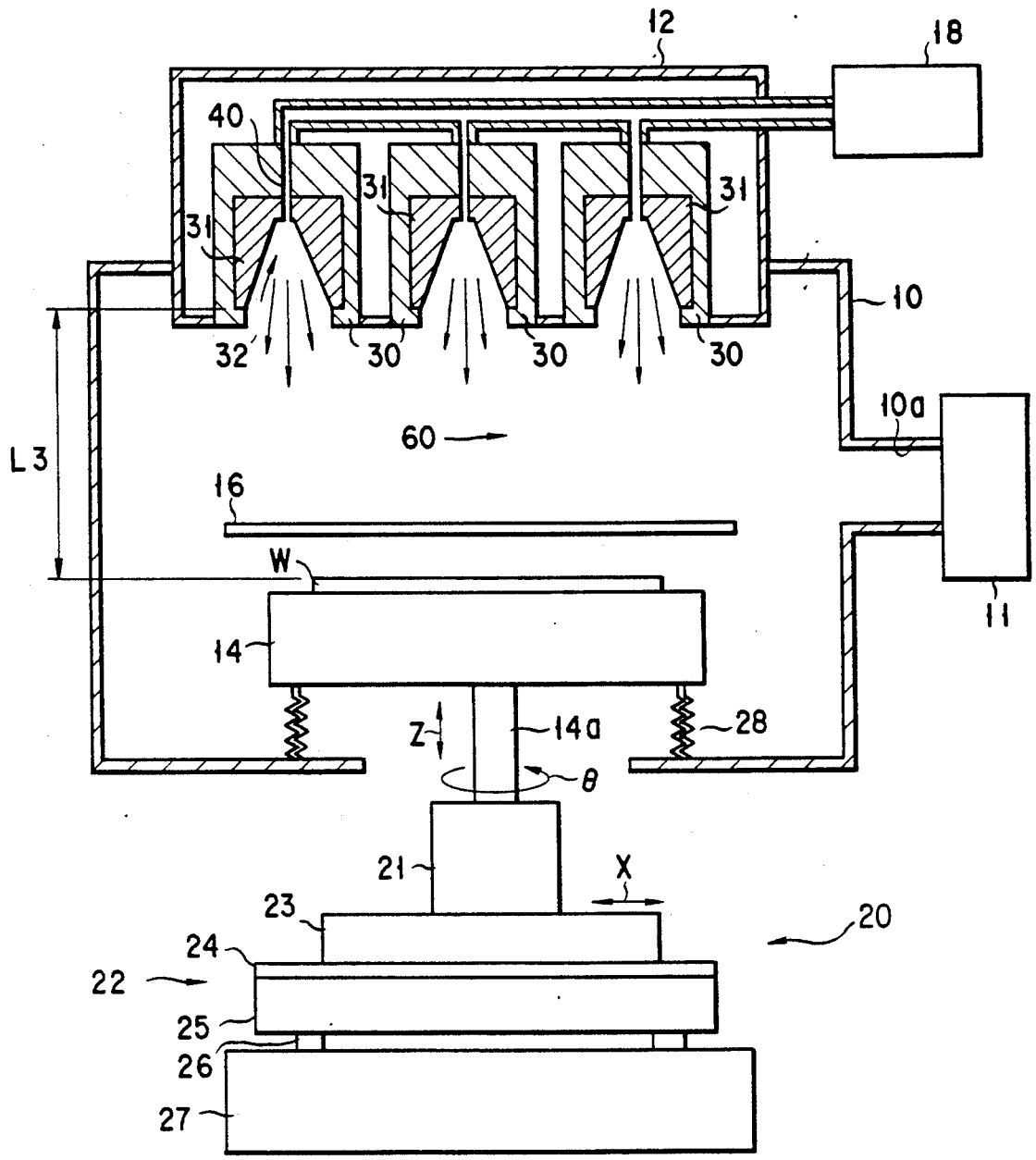
FIG. 2 is a cross-sectional view showing a magnetron sputtering apparatus according to an embodiment of the present invention.

FIG. 2 is a schematic view showing a magnetron sputtering apparatus according to an embodiment of the invention. The magnetron sputtering apparatus comprises a vacuum chamber 10 in which film-forming processing is carried out, a sputtering gun assembly 31 including a plurality of magnetron sputtering guns 30, a gas supply source 18 for supplying a sputtering gas to the sputtering guns 30, a support member 14 for supporting a semiconductor wafer W to be processed, and a movement mechanism 20 for moving the support member 14.

An exhaust port 10a is formed at a side wall of the vacuum chamber 10, and a vacuum pump 11 is connected to the exhaust port 10a. The chamber 10 is evacuated by the vacuum pump 11 to keep the inside of the chamber 10 at a desired vacuum degree.

The support member 14 is provided at the bottom region of the vacuum chamber 10, and has a heating function. The gun assembly 12 is situated above the support member 14. Each of the sputtering guns 30 of the gun assembly 12 has a target 31 with a recess 32. The target 31 is sputtered by a plasma of the sputtering gas supplied from the gas supply source 18. Thereby, sputter particles are emitted towards the wafer W. The detailed structure of the sputtering gun 30 will be described later.

A shutter 16 is provided between the assembly 31 and the wafer W on the support member 14. Preliminary sputtering is performed in the state in which the shutter 16 is closed. The shutter is opened when main sputtering is performed.

The movement mechanism 20 is provided below the support member 14. The movement mechanism 20 is coupled to the support member 14 by means of a driving shaft 14a. The movement mechanism 20 comprises a first movement unit 21 for moving the support member 14 in the vertical direction (Z-direction) and rotational direction ($\theta$-direction), and a second movement unit 22 for moving the support member 14 in the horizontal direction.

In the first movement unit 21, for example, the torque of a motor is converted to a linear driving force by a bail screw mechanism, etc., thereby vertically moving the support member 14 coupled to the driving shaft 14a, and the support member 14 is rotated by the rotation of the motor.

The second movement unit 22 comprises an X-table 23, X-table rails 24, a Y-table 25, Y-table rails 26, and a base 27. The X-table 23, along with the first movement unit 21, is movable in the X-direction. The Y-table 25, along with the first movement unit 21 and X-table 23, is movable in the Y-direction (perpendicular to the X-direction) on the Y-table rails 26 mounted on the base 27.

Since the first movement unit 21, X-table 23 and Y-table 25 are independently movable, as stated above, the support member 14 coupled to the driving shaft 14a is movable in the X-, Y-, Z- and $\theta$-directions independently.

Since the movement mechanism 20 is provided outside the vacuum chamber 10, heat and dust of the movement mechanism 20 does not adversely affect the vacuum condition of the vacuum chamber 10.

A bellows 28 is provided between the bottom of the support member 14 and the bottom of the vacuum chamber 10. When the bellows 28 expands and contracts the support 14 is moved in the Z-direction. When the support 14 is moved in the X- and Y-directions, the bellows 28 deforms in a direction inclined to the vertical axis. Accordingly, even when the support member 14 is moved by the movement mechanism 50 in the X-, Y- and Z-directions, the vacuum condition of the vacuum chamber is maintained.

Figure 3:
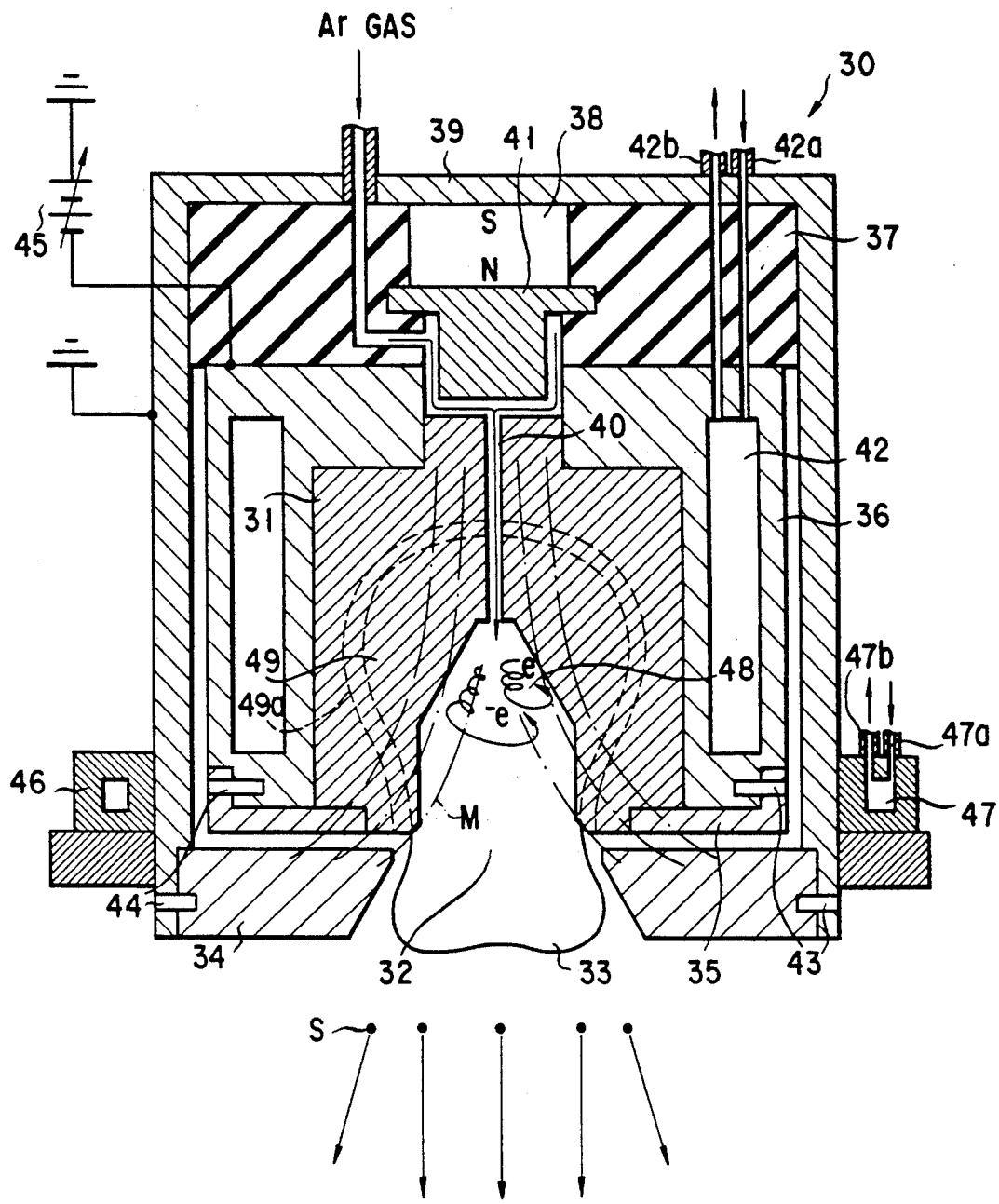
FIG. 3 is a cross-sectional view showing an embodiment of a sputtering gun used in the apparatus of FIG. 2.
Figure 4:
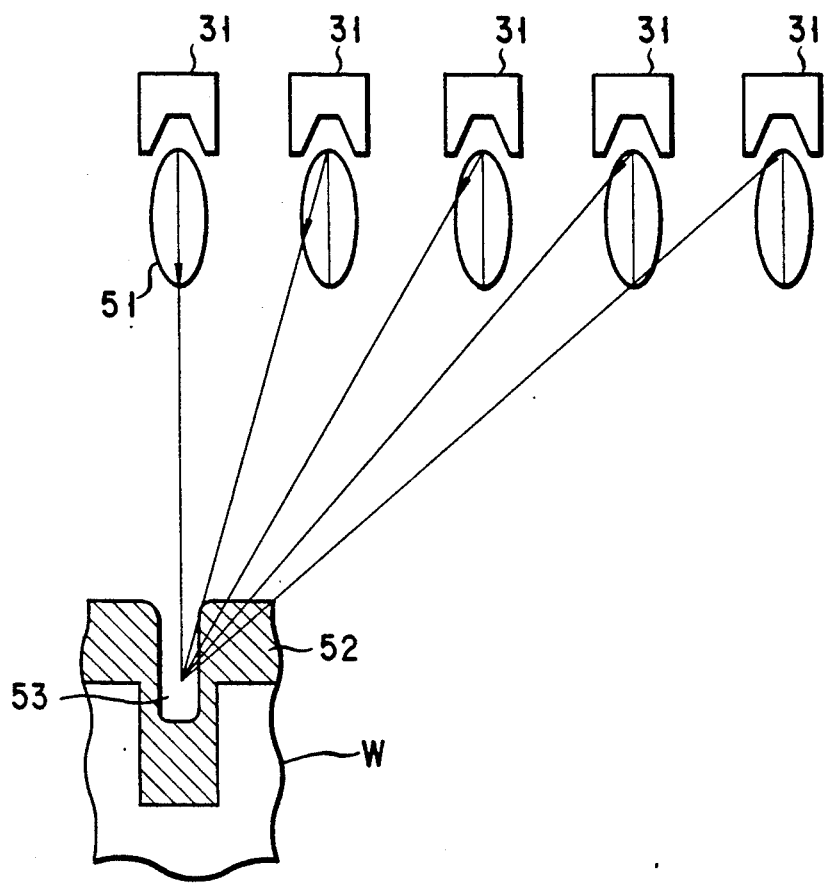
FIG. 4 shows the state in which a thin film is formed in a contact hole by the apparatus of FIG. 2.

FIG. 3 shows an example of the structure of the sputtering gun 30 of the gun assembly 12. The sputtering gun 30 comprises a target 31, an anode 34, a target clamp assembly 35, a target cooling block 36, an insulator 37, a magnet 38 and a yoke 39.

The target 31 is formed of a film-forming material such as aluminum, copper, titanium or titanium nitride. The target 31 has a recess 32 opening towards the wafer W. The recess 32 has an inverted tapering shape, having a diameter increasing towards its opening end. A gas supply port 40 is formed at the bottom portion of the recess 32. A sputtering gas (plasma gas) of Ar, etc. is supplied from the gas supply source 18 to the recess 32 via the gas supply port 40.

The magnet 38 is situated above the target 31, i.e. on the rear side of the target 31. A pole piece 41 of a magnetic material is situated on the target 31 side of the magnet 38, so as to define the gas passageway. Yoke 39 is provided to define the outside part of the sputtering gun 30. The yoke 39 constitutes a magnetic closed circuit between the target 31 and the magnet 38 and between the anode 34 and the magnet 38. As a result, magnetic force lines M are produced between the anode 34, provided on the opening side of the target 31, and the magnet 38. That is, a magnetic field is produced in the recess 32.

The anode 34 is formed of, e.g. aluminum, and it has an opening equal or greater than the opening of the target 31. The anode 34 serves also as a shield ring for shielding sputter particles.

The target cooling block 36 has a refrigerant passage 42 and has a substantially cylindrical shape. A target 31 is engaged with the inside of the block 36. The block 36 and the target 31 are fixed by a target clamp assembly 35 on the opening side of the block 36. The anode 34 is fixed such that pins 44 are inserted into notches 43 formed in the yoke 39 and the anode 34. The target clamp assembly 35 is fixed such that pins 44 are inserted into notches 43 formed in the assembly 35 and the target cooling block 36. The target 31 and the anode 34 are electrically insulated by the insulator 37.

A refrigerant is supplied to the refrigerant passage 42 of the target cooling block 36 through refrigerant supplying/discharging pipes 42a and 42b, thereby cooling the target 31. A cooling ring 46 is provided outside the yoke 39, and a refrigerant is supplied to a refrigerant passage 47 formed in the ring 46 via cooling water supplying/discharging pipes 47a and 47b, thereby cooling the yoke 39.

The target 31 is connected to a DC power supply 45, and a voltage of, e.g., $-300$ to $-800$ V is applied to the target 31 from the power supply 45. The anode is grounded. Thus, an electric field is produced between the anode 34 and the target 31, i.e. in the recess 32. Thus, an orthogonal electromagnetic field is produced by the component of the magnetic field produced in the recess 32, which is crossed to the electric field at right angles.

In the magnetron sputtering apparatus having the above structure, the semiconductor wafer W to be processed is placed on the support member 14. The vacuum chamber 10 is evacuated by the vacuum chamber 11, e.g. to 0.05–10 mTorr.

Sputtering is performed in the state in which the semiconductor wafer W to be processed is moved relative to the sputtering gun 30 by the movement mechanism 20.

In sputtering, a sputtering gas or plasma-generating gas of Ar gas, etc. is supplied to the recess 32 of target 31 of sputtering gun 30, from the gas supply source 18 via the gas supply port 40. A voltage of $-300$ V to $-800$ V is applied across the target 31 and anode 34. Thereby, a sputtering gas plasma is produced in the recess 32.

Electrons 48 in a plasma region 33 is confined in the recess 32 by magnetic force lines M. Cyclon motion of ions, e.g. argon ions, in the plasma is caused by the crossed electromagnetic field, and the ions collide with the wall of the target 31. Thereby, sputter particles S is emitted from the target 31. The emitted sputter particles S go out from the opening of the target 31, but sputter particles colliding with the wall of the target 31 are deposited on the target once again. However, such deposited sputter particles are sputtered by the argon ions once again and emitted downwards from the opening of the target 31. As a result, a flow of sputter particles S, whose direction is controlled, is obtained.

In this case, since the gas supply port 40 of the target 31 has a small diameter and the recess 32 has a diameter increasing towards its opening end, a pressure gradient of supplied gas is created from the proximal end of gas supply towards a sputtering processing space 60. Even if the pressure of the processing space 60 is low, the plasma is stably produced. For example, the pressure of the plasma-generating region 33 is set at, e.g. 1 mTorr order so that a plasma can be stably produced, or and the pressure of the processing space 60 is set at, e.g. 0.1 mTorr order so that possibility of collision between sputter particles and gas can be reduced. In addition, a plasma can be produced even if the pressure of the recess 32 is 0.1 mTorr order, e.g. 0.2 mTorr, which is lower than the conventional pressure by one order. In this case, the pressure of the processing space 60 can be lowered further.

Thus, the sputter particles S can be emitted from the opening of the recess 32 in a controlled direction and the pressure of the sputtering processing space 60 can be lowered, and therefore sputtering can be performed with high efficiency by using sputter particles having high directivity. Even when the wafer having contract holes is subjected to sputtering processing, a thin film can be formed with high step coverage and high efficiency.

The reason for this will now be described. As has been described above, since sputter particles S are emitted from the opening of the recess 32, the particles S are emitted with a distribution indicated by ellipses 51. Specifically, slanting components of the sputter particles S, other than a vertical component, are small, and it is possible to prevent sputter particles from being concentrated at shoulder portion of the contact hole 52. Thus, a sufficient amount of sputter particles reach the contact hole, and a thin film 53 can be formed with high step coverage and high efficiency. The directivity of sputter particles can be controlled by varying the length of the anode 34 provided on the distal end side of the target 31. That is, the anode 34 functions as a shield ring. For example, the length of the anode 34 is increased when it is desired to increase the directivity of the sputter particles.

Practically, when a contact hole having a diameter of 0.5 micron and a depth of a 1 micron was subjected to sputtering processing by using the above sputtering gun, a sufficient amount of sputtering particles reached the inside of the contact hole with no concentrated deposition of particles on a shoulder of the contact hole. In this case, a film of 1 micron was formed on the wafer surface and a film of 0.8 micron was formed in the contact hole. Specifically, step coverage of 80% or more was achieved quickly.

When such sputtering processing is repeated, the target 31 is gradually worn out by generation of sputter particles, and a sputter portion 49 is enlarged, as indicated by a broken line 49a (FIG. 3). In this case, however, only the size of the recess 32 varies, and the above function is not degraded.

The target 31 is formed of a relatively small size so that it can easily be fitted in the space of the target cooling block 36. Specifically, a clearance is provided between the outer peripheral surface of the target 31 and the inner peripheral surface of the cooling block 36, so that the target 31 can easily mounted and removed and the target 31 can be put in close contact with the inner peripheral surface of the target cooling block 36 by thermal expansion of the target 31. When the target is to be exchanged, the target is cooled and contracted and a gap exists between the target 31 and the target cooling block 36. Thus, the target 31 can be removed from the target cooling block 36 and replaced with a new target very easily. When the target electrode is turned on, the target 31 and target cooling block 36 expand due to heat generated, resulting in firm fixation of the target 31 and block 36. Thus, the heat of the target 31 is transmitted to the target cooling block 36 and therefore the target 31 can be cooled without providing special cooling means for the target 31. Accordingly, the structure of the target 31 is simplified only with the provision of the gas supply port 40. In addition, the cooling water supply pipes for supplying cooling water to the target cooling block 36 requires no removal, once the pipes are fixed. Thus, the mechanism for supplying/discharging cooling water is simple.

Figures 5A, 5B, 5C:
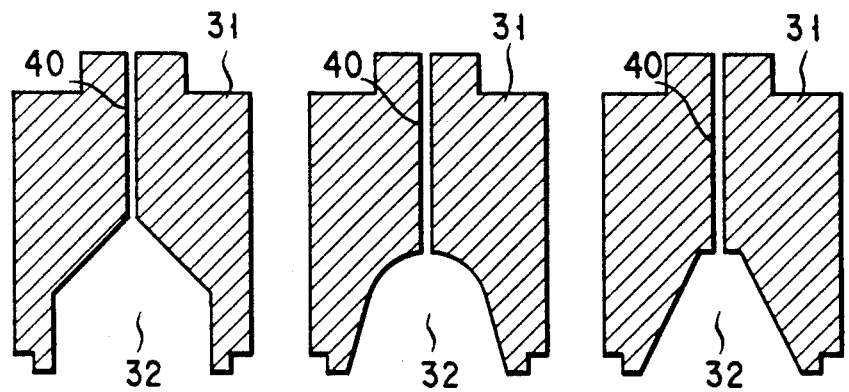
FIGS. 5A to 5C are cross-sectional views showing examples of the shape of the target.

The recess 32 of the target 31 may have various shapes, for example, as shown in FIGS. 5A to 5C. In FIG. 5A, a distal end portion is cylindrical and a bottom portion has a funnel shape. The gas supply port 40 is formed at the center area of the bottom portion. In FIG. 5B, a distal end portion of the recess 32 is conical and a bottom portion is semi-spherical. Like the shape of FIG. 5A, the recess is formed at the center of the bottom portion. In FIG. 5C, the recess 32 is a conical (or pyramidal) shape with a top cut, and the gas supply port 40 is formed at the center of the bottom portion.

Next, the arrangement of sputtering guns 30 of the gun assembly 12 and the relative movement of the sputtering guns 30 and wafer W will be described.

The gun assembly 12 comprises, for example, seven sputtering guns 30, and their targets are arranged as shown in FIG. 6. In FIG. 6, the seven targets 31 are arranged at the center A of the sputtering gun assembly 12 and the apices of a hexagon whose center of gravity agrees with the center A. By this arrangement, the targets 31 can be arranged as close as possible. Thus, the space needed for the sputtering gun assembly 12 can be reduced to a minimum, while using the sputtering guns 30 having a predetermined size, and the space is used with high efficiency. The arrangement of the targets 31 is not limited to this, and it can be changed depending on various conditions such as the size of wafer W, the opening size of each sputtering gun 30, etc.

The target 31 of the sputtering gun 30 employed in this embodiment is provided with the recess 32. Thus, as stated above, the sputter particles S are emitted with high directivity. Accordingly, a great deal of sputter particles S emitted substantially vertically are used for forming a thin film in a hole located to face the opening of the target 31. However, when the wafer W is stationary, the amount of sputter particles directed to a wafer portion located at a position facing a middle point between two adjacent targets 31 decreases. In addition, the vertical component of sputter particles decreases. That is, when the wafer W is stationary, the amount of deposited sputter particles and incidence angle of sputter particles vary from area to area on the wafer W.

In order to avoid such drawbacks, the wafer W is moved relative to the sputtering gun 30 by the moving mechanism 20. For example, as shown in FIG. 7, the wafer W is raster-scanned in the X- and Y-directions in parallel to the major surface of the wafer W. For example, in FIG. 6, the raster scan is performed in the range of ½ of the distance L1 between centers A and B of two adjacent targets 31 and the distance L2 between C and C'. Thus, a sufficient amount of sputter particles can be deposited uniformly on the entire surface of the wafer W under substantially the same conditions.

Next, a description will now be given of the case wherein the wafer w was scanned in the Z-direction (FIG. 7). When the sputtering gun assembly 12 is shifted towards the wafer W, the apparent angle of the contact hole to the target 31 increases, and a great deal of sputter particles are deposited on the shoulder portion of the contact hole. By contrast, when the assembly 12 is shifted away from the wafer W, the apparent angle decreases and a great deal of sputter particles are deposited in the contract hole. Thus, the shape of the thin film can be controlled by scanning the wafer W in the Z-direction.

Figure 1:
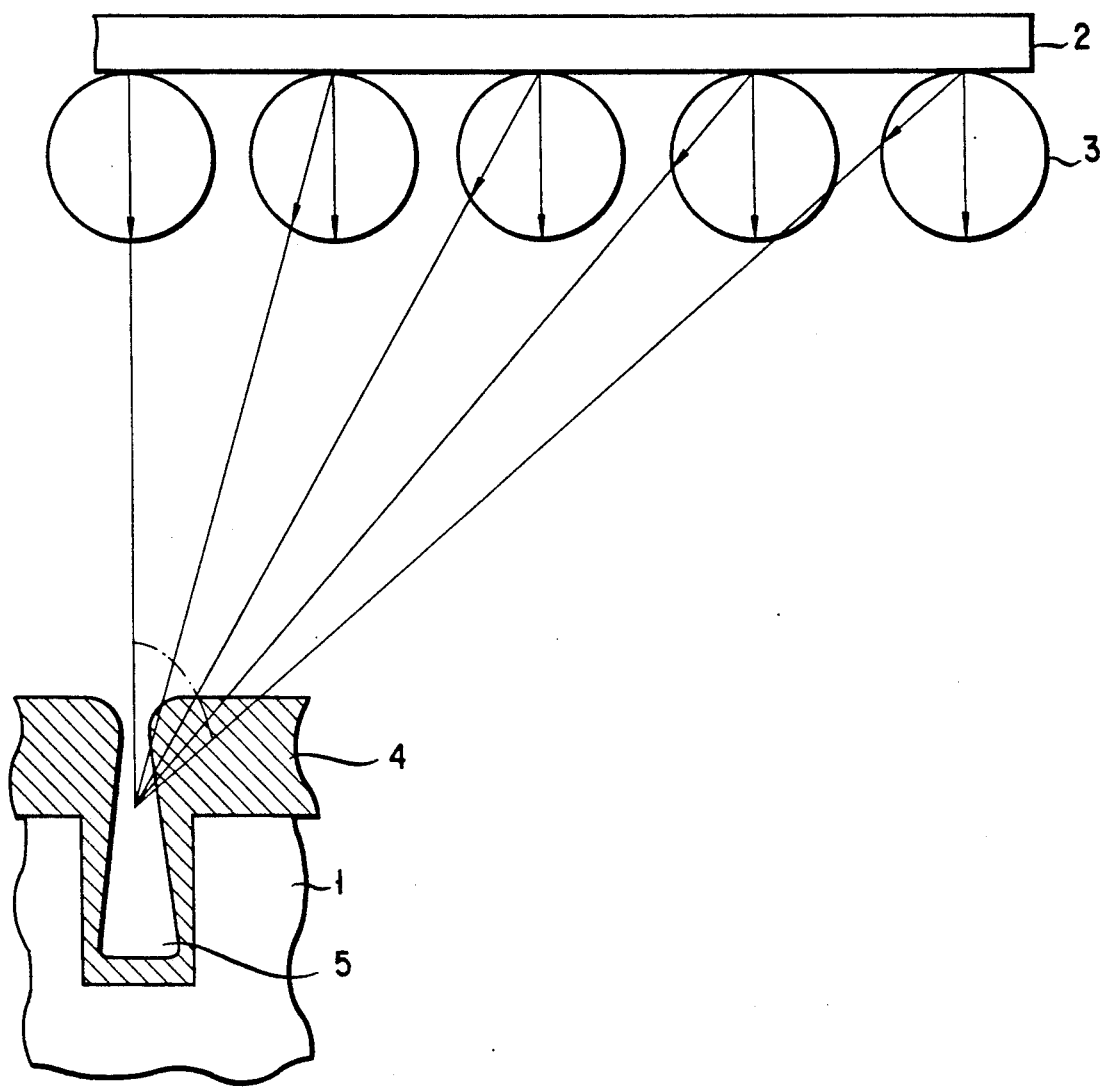
FIG. 1 shows the state in which a thin film is formed in a contact hole by using a conventional flat sputtering gun.

In this case, the distance of scan in the Z-direction, i.e. the range of variation of distance L3 in FIG. 1, is, e.g. 100 mm to 250 mm. Within this range, the Z-directional scan is possible without changing the volume of the vacuum chamber 10.

As has been described above, the X-, Y- and Z-directional scans can be performed independently. Scanning in only one direction may be performed on an as-needed basis, or scanning in two or more directions can be performed. By combining the directions of scanning, a thin film with higher uniformity can be obtained.

In addition to the X-, Y- and Z-scans, the wafer W may be rotated about its center. By the rotational scan, the uniformity of the film to be formed along the circle connecting the centers of targets 18 can be enhanced. The rotational scan of the wafer W may be performed in combination of one or more of the X-, Y-and Z-scans, or the rotational scan may be performed singly.

In addition, eccentric rotational scan or movement may be performed about an eccentric shaft set off from the center of wafer W. In the case where the rotational scan is performed about the center of the wafer W, the distances between the center of the assembly 12 and the centers of the targets situated on the peripheral area of the assembly 12 must be made different from each other in order to enhance the uniformity of the film formation in the radial direction. In such case, it becomes difficult to arrange the targets 31 of the sputtering gun assembly 12 with the highest density. However, if the eccentric rotational scan is performed, the uniformity of the film formation can be enhanced both in the radial direction and in the circumferential direction, with the highest density of arrangement of targets 31 shown in FIG. 6 maintained and with no complexity of structure incurred. In this case, too, the rotational scan of the wafer W may be performed in combination of one or more of the X-, Y- and Z-scans, or the rotational scan may be performed singly.

Further, it is possible to displace the position of the center shaft of the assembly 12 from the position of the wafer W, and rotate both the assembly 12 and wafer W. By this rotation, the uniformity of film formation can be enhanced in a broader two-dimension plane.

When the above rotational scan is performed, it is possible to use, as a hermetic seal, a magnetic seal, an O-ring, or another type of hermetic seal which allows rotation.

The relative movement between the sputtering guns and wafer W is not limited to the above. X-directional movement, Y-directional movement, Z-directional movement, circular movement, eccentric movement, and rotational movement and revolving movement may be combined variously. Such relative movement may be performed continuously or intermittently by using a step motor.

Figure 8:
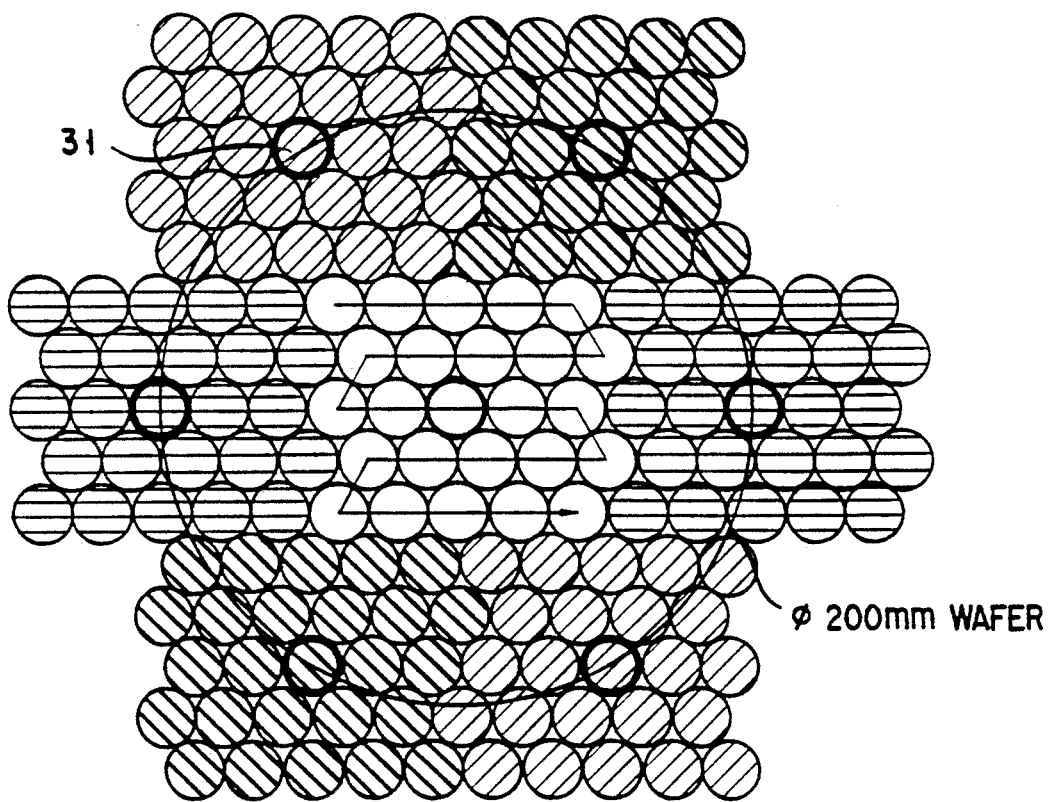
FIG. 8 schematically shows arrangement and movement of a sputtering gun assembly of the example of the present invention.

A Ti film was actually formed on an 8-inch wafer by using the magnetron sputtering apparatus of the present invention. The results relating to the formation of the Ti film will now be stated. The gun assembly employed had the structure shown in FIG. 8. The distance between the centers of the two adjacent targets was 100 mm. The distance between the tip end of the Ti target and the surface of the wafer W was fixed at 80 mm. The vacuum chamber was evacuated by the vacuum pump, and Ar was introduced from the gas supply port of the target at a flow rate of 10 sccm. The pressure in the sputtering processing space 60 was 0.2 mTorr, and the pressure in the recess of the target, i.e. the plasma-producing region, was 1 mTorr. Then, electric power of 2 kw was supplied from the targets to the targets at −400 to −900 V. Thereby, an electric field was produced and a magnetic field of 400 gauss was produced in the recess. The wafer W was mounted on the support member 14, and the shutter 16 was opened. The support member 14 was moved by the step motor over the distance of 20 mm, as shown in FIG. 8, at a speed of 200 m/sec. The support member 14 was stopped at every position for two seconds, and the entire 8-inch (about 200 mm) wafer was moved in 25 steps. Thus, sputter particles were emitted from each target and a Ti film 100 nm thick was deposited on the wafer. The time for film formation was 52.4 seconds. Specifically, the speed for film formation was 114.5 nm/min. As a result, a high-quality Ti film having a uniform thickness and step coverage was formed on the wafer. In addition, the speed for film formation was increased by increasing the input electric power.

The present invention is not limited to the above embodiments, and various changes and modifications may be made.

The structure of the sputtering gun is not limited to that shown in FIG. 3. Structures such as those shown in FIGS. 9 and 10 can be adopted.

Figure 9:
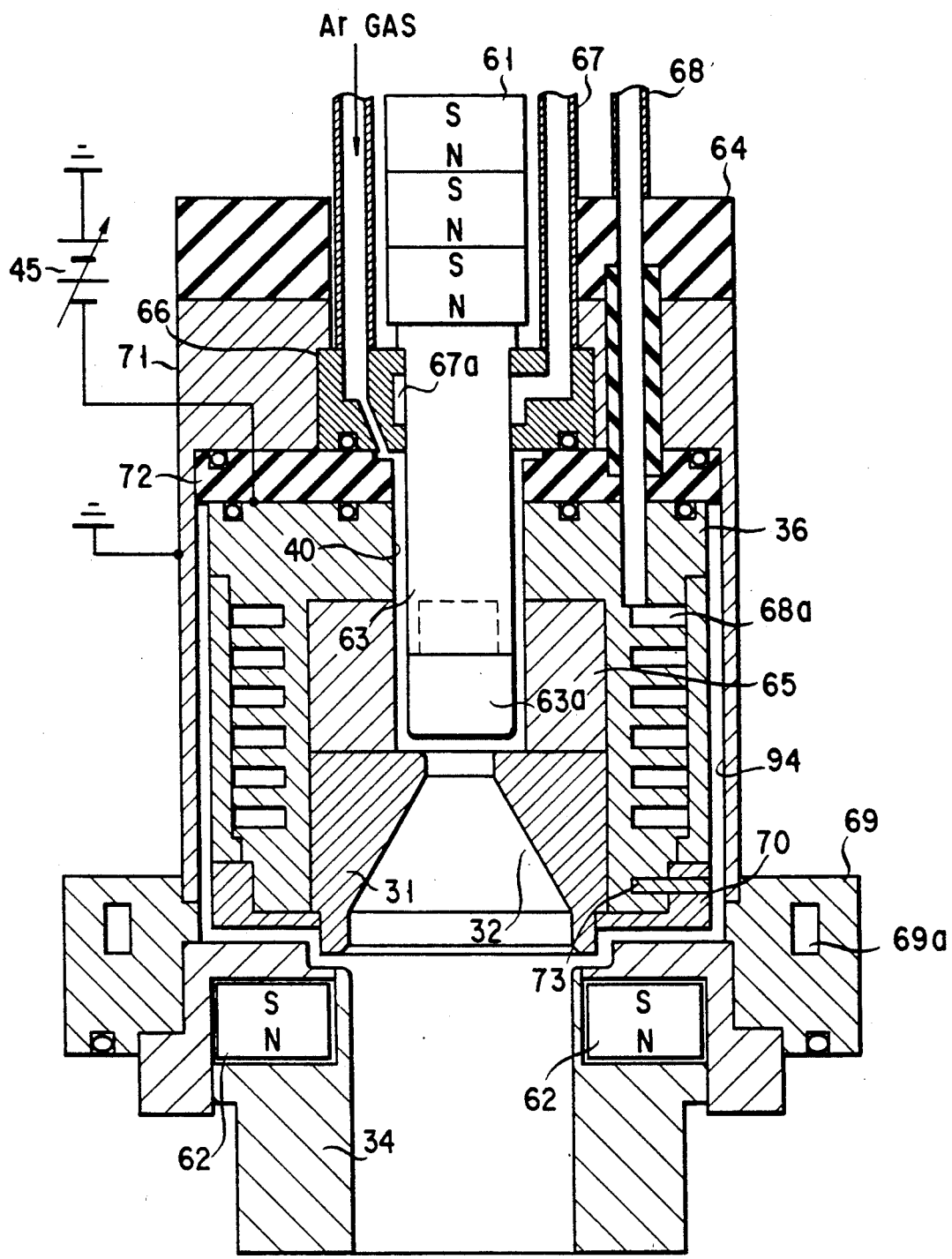
FIG. 9 shows a modification of the sputtering gun according to the present invention.
Figure 10:
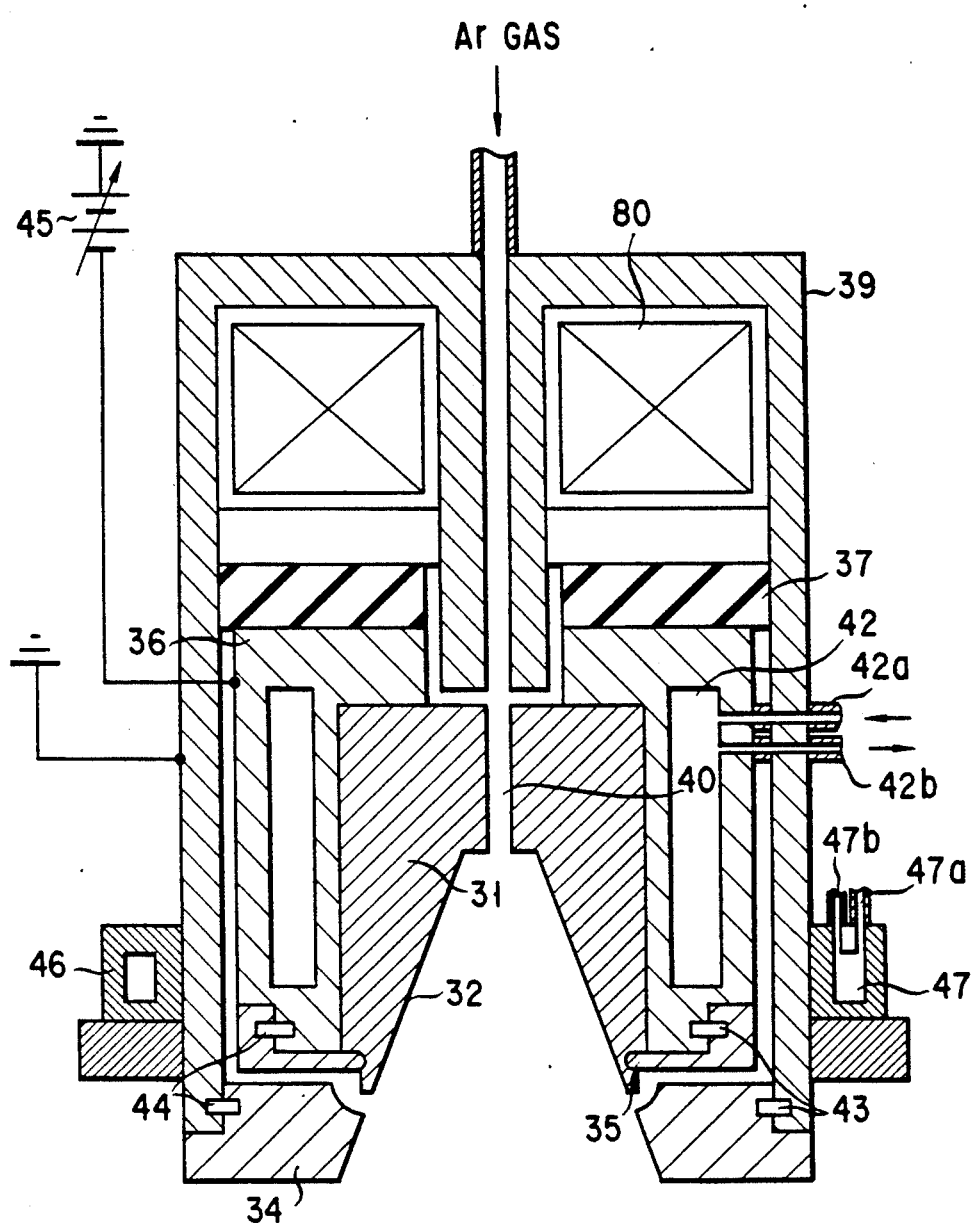
FIG. 10 shows another modification of the sputtering gun according to the present invention.

FIG. 8 shows a sputtering gun having a plurality of magnets, without using a yoke. FIG. 9 shows a sputtering gun having electromagnet as magnetic field generating means. In FIGS. 8 and 9, the structural elements substantially identical to those in FIG. 3 are denoted by common reference numerals, and a description thereof is omitted.

In the sputtering gun shown in FIG. 8, cylindrical magnets 61 are provided above the target 31, i.e. on the rear side of the target 31. An annular magnet 62 is situated on the distal end side of the target 31. A magnetic pole piece 63 is connected to the target 31 side of the magnets 61, so as to define a gas passage. A threaded portion is provided on an end portion 63a of the pole piece 63, and the pole piece 63 is engaged with the body of the pole piece. Only the end portion 63a is exchangeable. Magnetic force lines extend between the magnets 61 and the magnet 62 via the pole piece 63. As a result, a magnetic field is created in the recess 32, like the sputtering gun shown in FIG. 3. The target cooling block 36 is provided with a helical refrigerant passage 68a, and a refrigerant is supplied through a refrigerant supply/discharge pipe 68. A cooling ring 66 for the pole piece is provided around the pole piece 63. A refrigerant passage 67a is formed in the cooling ring 66, and a refrigerant is supplied through the refrigerant passage 67a. An anode cooling ring 69 is provided around the anode 34, and a refrigerant passage 69a is formed in the ring 69. The sputtering gun is surrounded by a stainless steel member 71, and an insulating member 72 is interposed between the stainless steel member 71 and the target cooling block 36. Reference numeral 65 denotes a spacer interposed between the target 31 and the cooling block 36. Numeral 64 denotes an insulating member, and 70 denotes a clamping member.

The sputtering gun of FIG. 9 has substantially the same structure as that of FIG. 3, except that the permanent magnet 38 shown in FIG. 3 is replaced with an electromagnet 80. By using the electromagnet 80, the electric current can be varied in accordance with the wear of the target and the magnitude of the magnetic field can be varied.

In addition, by introducing a reaction gas into the vacuum chamber 10, reactive sputtering can be performed with high efficiency. A typical reactive sputter thin film employed in semiconductor manufacturing is a TiN film, a TiNO film, etc. In general, a film is manufactured by means of reactive sputtering, using a mixture of Ar gas and active N gas or a mixture of Ar, N and $O_2$ gasses.

A problem arising from the reactive sputtering process using active gas is that the sputtering efficiency decreases to about 1/5, as compared to the case of using only inert gas (Ar). In addition, the film deposited between electrodes is easily peeled, resulting in a source of abnormal discharge. However, such drawbacks can be overcome by introducing a reaction gas such as $N_2$ gas into the vacuum chamber 10 by use of the sputtering gun of the present invention.

Figure 11:
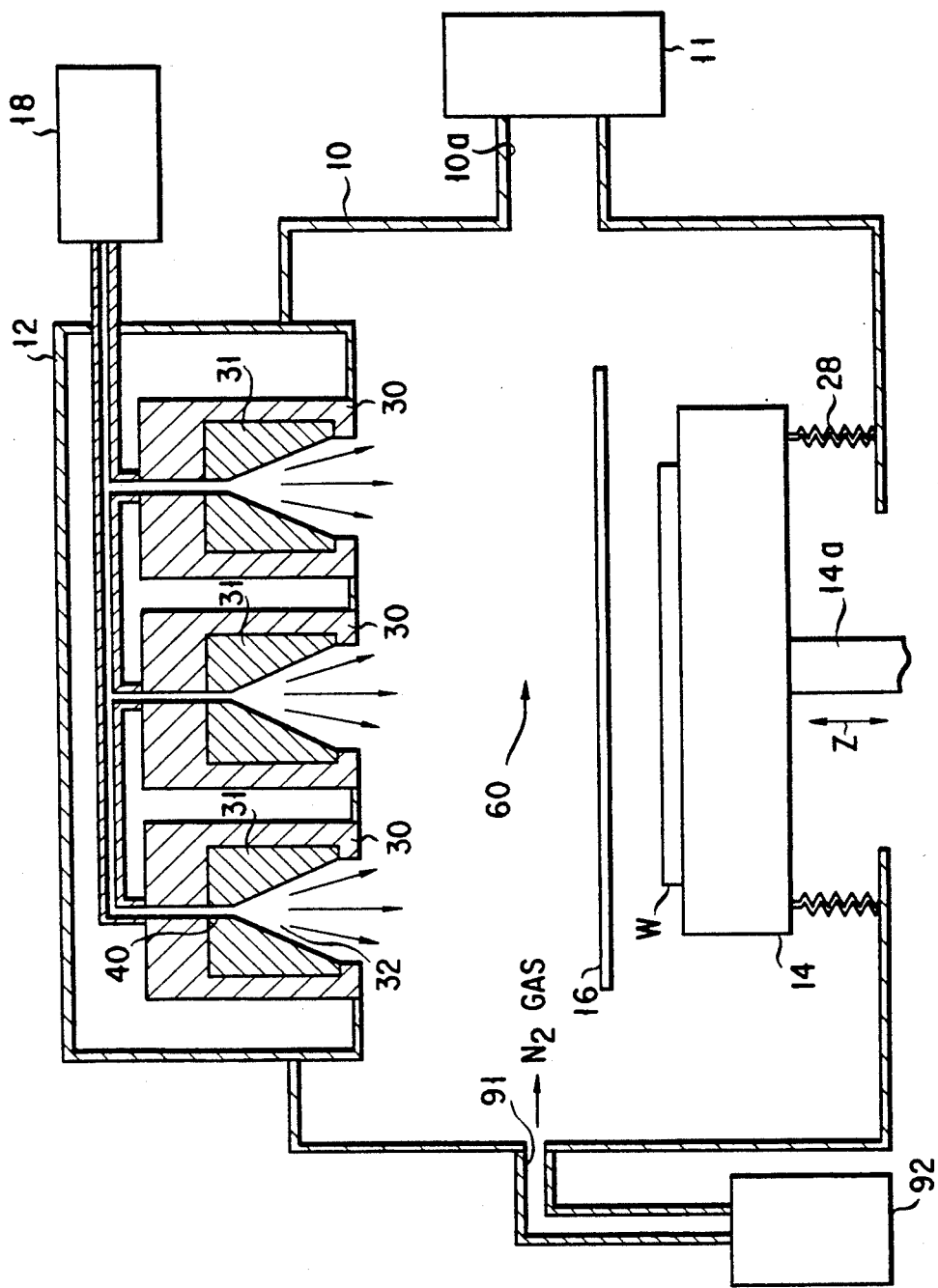
FIG. 11 is a cross-sectional view showing a magnetron sputtering apparatus according to another embodiment of the present invention.

For example, as shown in FIG. 11, a reaction gas introducing port 91 is formed at the side wall of the vacuum chamber 10. A reaction gas, e.g. nitrogen gas, is supplied from a reaction gas supply source 92 into the sputtering processing space 60 in the chamber via the reaction gas introducing port 91. When the sputter particles are, e.g. Ti, the sputter particles react with the introduced nitrogen gas, thereby forming a TiN film on the wafer W.

Figure 12:
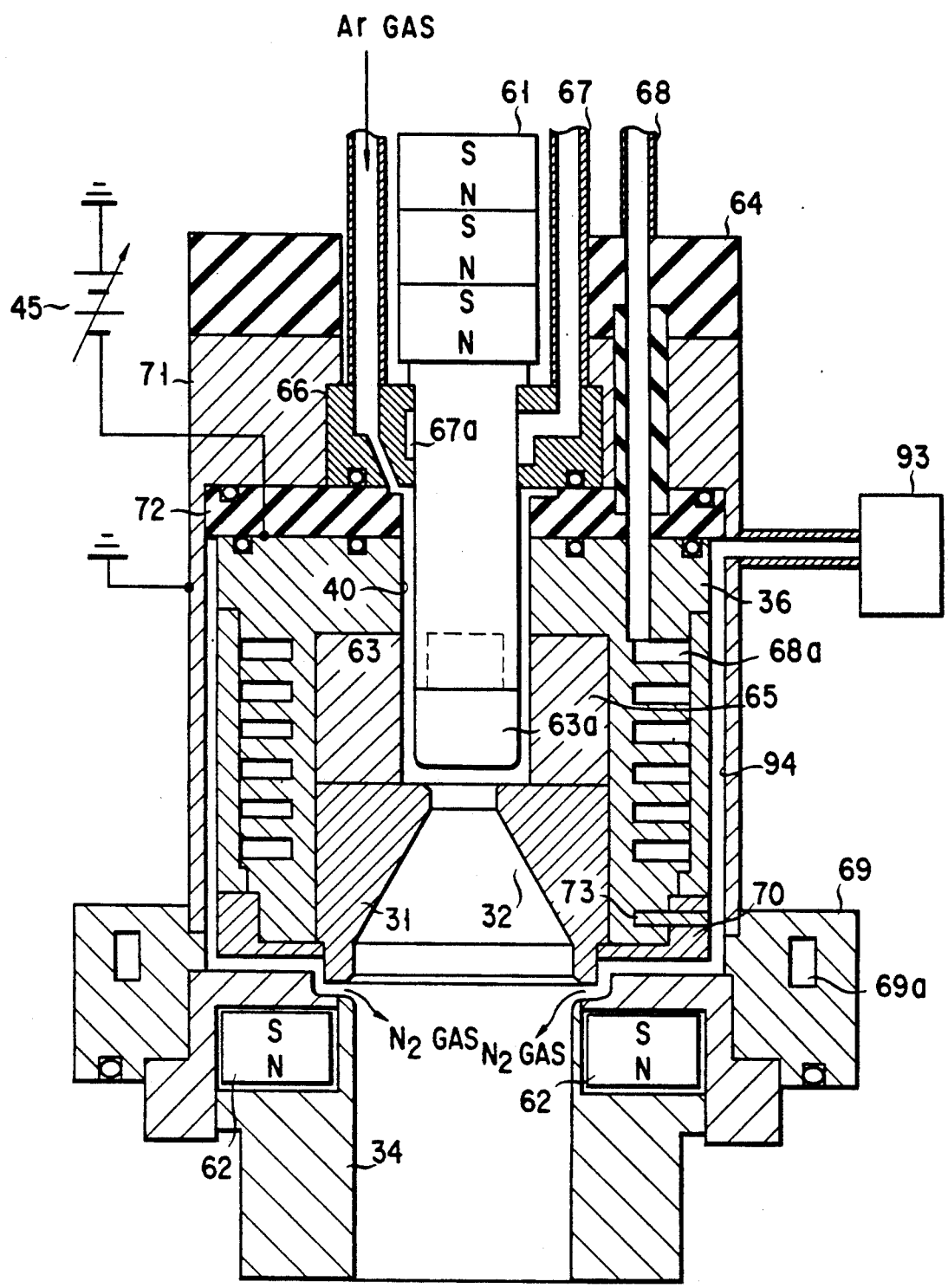
FIG. 12 shows still another modification of the sputtering gun according to the present invention.

Reaction gas (such as $N_2$ gas) supply ports may be provided in the opening of the sputtering gun 30, as shown in FIG. 12. Referring to FIG. 12, Ar gas as inert gas is introduced from the gas supply port 40. Ar gas flows to the processing space 60 of the sputtering apparatus through the opening space 34a of the anode 34. Active nitrogen (N)gas (or oxygen (O) gas) as a reaction gas is supplied from a reaction gas supply source 93 via a gas supply port 94, and flows to the processing space 60 through the opening space 34a of the anode 34. Since Ar gas passes through the plasma region, the ionizing efficiency and sputtering efficiency of Ar gas is high. The sputtered particles (for example, titanium (Ti) particles) are directed to the opening space 34a of the anode 34. The $N_2$ gas as reaction gas supplied from the gas supply port 94 reacts with sputter Ti particles in the opening space 34a of the anode 34 by the function of electrons flowing from the hollow recess 32 of the target 31 towards the anode 34. As a result, particles of a reaction product, for example titan nitride (TiN) particles are emitted to the processing space 60 of the sputtering apparatus and deposited on the wafer 1.

By separately providing the supply ports for inert gas and reaction gas, a decrease in efficiency of inert gas sputtering can be prevented. In addition, in the sputtering gun of FIG. 12, since gas is supplied through a gap between the target (cathode) and the anode, diversion of sputter particles can be prevented.

In addition, since the pressure in the processing space 60 is low, no dispersion of sputter particles due to introduced gas occurs, and diversion of sputter particles decreases. Thus, the size of the shield plate around the processing space can be reduced and the conductance is increased. Without enlarging the exhaust device, the exhaust performance can be increased by one order (i.e. about ten times). Thus, in combination with the lowering of discharge pressure, the background pressure can be improved by two orders (i.e. about 100 times) and the film quality can be enhanced.

Compared to the sputtering process using only $N_2$ gas, the film-formation rate in the sputtering process using only Ar gas is higher about 5 times. Even when the $N_2$ gas is supplied to the region where Ar sputtered particles are present, the film-formation rate in the Ar sputtering is higher than that in the $N_2$ sputtering about 3 times or more.

Further, in above embodiments, a plurality of sputtering guns are provided in the sputtering apparatus. However, a sputtering apparatus with a single sputtering gun can be adopted when an object to be processed is small.

The present invention is not limited to the case where the semiconductor wafer is used as an object to be processed. For example, the present invention is applicable to LCD substrates, magnetic discs, magnetic tapes, etc.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetron sputtering apparatus for forming a sputtering film on an object, comprising:
   (a) a vacuum chamber for accommodating the object;
   (b) a plurality of sputtering guns for emitting sputter particles to the object, each sputtering gun having,
      a target having a recess opening to the object,
      a sputtering gas supply source for supplying a sputtering gas from a bottom of the recess,
      a electric field producing mechanism for producing an electric field in the recess, thereby producing a plasma the sputtering gas, and
      a magnetic field producing mechanism for producing, in the recess, a magnetic field including a component intersecting the electric field at right angles;
   (c) a support member for supporting the object within the vacuum chamber; and
   (d) a movement mechanism for moving the sputtering guns and the support member relative to each other,
   wherein the sputter particles sputtered from the target by the plasma produced in the recess are deposited on the object.

2. The apparatus according to claim 1, wherein said movement mechanism includes a parallel covenant mechanism for causing relative movement parallel to the surface of the support member.

3. The apparatus according to claim 2, wherein said movement mechanism includes a first movement unit for causing relative movement in one direction parallel to the surface of the support member, and a second movement unit for causing relative movement in a direction perpendicular to the direction of the relative movement by the first movement unit.

4. The apparatus according to claim 1, wherein said movement mechanism includes a vertical movement mechanism for causing relative movement in a direction perpendicular to the surface of the support member.

5. The apparatus according to claim 1, wherein said movement mechanism includes a rotational movement mechanism for causing rotational movement.

6. The apparatus according to claim 1, wherein the vacuum chamber is kept at 0.05 to 10 mTorr.

7. A magnetron sputtering gun for emitting sputter particles towards an object to be processed situated within the vacuum chamber, comprising:
   a target having a recess opening to the object;
   a sputtering gas supply source for supplying a sputtering gas from a bottom of the recess;
   an electric field producing mechanism for producing an electric field in the recess, thereby producing a plasma of the sputtering gas; and
   a magnetic field producing mechanism for producing, in the recess, a magnetic field including a component intersecting the electric field at right angles,
   wherein the pressure within the recess is set at a higher value than that within the vacuum chamber, and thereby a pressure gradient is created from the recess towards the vacuum chamber, and the sputter particles are emitted from the target into the vacuum chamber by the plasma produced in the recess.

8. The sputtering gun according to claim 7, wherein said sputtering gas supply source includes a gas supply passage for introducing the gas into the recess.

9. The sputtering gun according to claim 8, wherein the gas supply passage communicates with a center area of a base portion of the recess.

10. The sputtering gun according to claim 7, wherein said electric field producing mechanism includes an anode and a DC power supply, and wherein a voltage is applied by the DC power supply across the target and the anode.

11. The sputtering gun according to claim 7, wherein said magnetic field producing mechanism includes a permanent magnet and a yoke attached to the permanent magnet, and wherein magnetic force lines are formed between one pole of the permanent magnet and the yoke.

12. The sputtering gun according to claim 7, wherein said magnetic field producing mechanism includes a plurality of permanent magnets, and producing magnetic force lines extending between one pole of one of the permanent magnets and another pole of another permanent magnet.

13. The sputtering gun according to claim 7, wherein said magnetic field producing mechanism includes an electromagnet.

14. The sputtering gun according to claim 7, further comprising a cooling mechanism for cooling the target.

15. The sputtering gun according to claim 7, which comprises a mechanism for defining the direction in which the sputter particles are emitted.

16. The apparatus according to claim 15, wherein the recess is kept at no less than 1 mTorr but less than 10 mTorr, and the vacuum chamber is kept at no less than 0.05 mTorr but less than 1 mTorr.

17. The sputtering gun according to claim 7, which comprises a reaction gas supply source for supplying a reaction gas to the sputter particles, wherein the sputter particles react with the reaction gas.

18. The magnetron sputtering gun according to claim 7, wherein the recess is kept at no less than 1 mTorr but less than 10 mTorr, and the sputter particles are emitted into the vacuum chamber which is kept at no less than 0.05 mTorr but less than 1 mTorr.

19. A magnetron sputtering apparatus for forming a sputtering film on an object, comprising:
   (a) a vacuum chamber for accommodating the object;
   (b) a plurality of sputtering guns for emitting sputtering particles to the object, each sputtering gun having,
      a target having a recess opening to the object,
      a sputtering gas supply source for supplying a sputtering gas into the recess,
      an electric field producing mechanism for producing an electric field in the recess, thereby producing a plasma of the sputtering gas, and
      a magnetic field producing mechanism for producing, in the recess, a magnetic field including a component intersecting the electric field at right angles;
   (c) a support member for supporting the object within the vacuum chamber;
   (d) a reaction gas supply source for supplying a reaction gas to the sputter particles emitted from each of said sputtering gun into the vacuum chamber; and
   (e) a mechanism for moving the sputtering guns and the support member relative to each other,
   wherein the sputter particles react with the reaction gas within the vacuum chamber, and a resultant reaction produce is deposited on the object.

20. The apparatus according to claim 17, wherein said sputtering gas contains Ar and said reaction gas contains $N_2$.

21. The apparatus according to claim 18, wherein said target is formed of Ti, and said sputter particles react with said reaction gas, thereby forming a TiN film on the object.

22. A magnetron sputtering apparatus for forming a sputtering film on an object, comprising:
   (a) a vacuum chamber for accommodating the object;
   (b) a plurality of sputtering guns for emitting sputter particles to the object, each sputtering gun having,
      a target having a recess opening to the object;
      a sputtering gas supply source for supplying a sputtering gas from a bottom of the recess,
      an electric field producing mechanism for producing an electric field in the recess, thereby producing a plasma of the sputtering gas, and
      a magnetic field producing mechanism for producing, in the recess, a magnetic field including a component intersecting the electric field at right angles;
   (c) a support member for supporting the object within the vacuum chamber; and
   (d) a mechanism for moving the sputtering guns and the support member relative to each other,
   wherein the pressure within the recess is set at a higher value than that within the vacuum chamber, and thereby a pressure gradient is created from the recess towards the vacuum chamber, and the sputter particles are emitted from the target into the vacuum chamber by the plasma produced in the recess.

23. A magnetron sputtering gun for emitting sputter particles towards an object situated within the vacuum chamber, comprising:
   a target having a recess opening to the object;
   a sputtering gas supply source for supplying a sputtering gas from a bottom of the recess;
   an electric field producing mechanism for producing an electric field in the recess, thereby producing a plasma of the sputtering gas;
   an magnetic field producing mechanism for producing, in the recess, a magnetic field including a component intersecting the electric field at right angles; and
   a reaction gas supplying source for supplying a reaction gas to the sputter particles emitted from the target in a region apart from the plasma,
   wherein the sputter particles react with the reaction gas, and a resultant reaction product is formed.

24. The magnetron sputtering gun according to claim 23, wherein said sputtering gas contains Ar and said reaction gas contains $N_2$.

25. The magnetron sputtering gun according to claim 23, wherein said target is formed of Ti, and said sputter particles react with said reaction gas, thereby producing TiN.

* * * * *